(12) United States Patent
Hamilton

(10) Patent No.: US 11,418,932 B2
(45) Date of Patent: Aug. 16, 2022

(54) ENVIRONMENTAL SENSOR-BASED RADIO TRANSMITTER OF A UTILITY METER SYSTEM

(71) Applicant: Neptune Technology Group Inc., Tallassee, AL (US)

(72) Inventor: David Hamilton, Auburn, AL (US)

(73) Assignee: Neptune Technology Group Inc., Tallassee, AL (US)

( * ) Notice: Subject to any disclaimer, the term of this patent is extended or adjusted under 35 U.S.C. 154(b) by 61 days.

(21) Appl. No.: 16/505,991

(22) Filed: Jul. 9, 2019

(65) Prior Publication Data
US 2020/0029186 A1    Jan. 23, 2020

Related U.S. Application Data

(60) Provisional application No. 62/699,349, filed on Jul. 17, 2018.

(51) Int. Cl.
| | |
|---|---|
| *H04W 4/38* | (2018.01) |
| *G01R 19/165* | (2006.01) |
| *G08B 21/18* | (2006.01) |
| *H04W 52/26* | (2009.01) |
| *H04W 52/30* | (2009.01) |
| *H04W 52/48* | (2009.01) |
| *G01R 22/06* | (2006.01) |
| *H04W 52/24* | (2009.01) |
| *H04W 52/28* | (2009.01) |
| *H04W 52/14* | (2009.01) |

(52) U.S. Cl.
CPC ............ *H04W 4/38* (2018.02); *G01R 19/165* (2013.01); *G08B 21/182* (2013.01); *H04W 52/267* (2013.01); *H04W 52/30* (2013.01); *H04W 52/48* (2013.01)

(58) Field of Classification Search
None
See application file for complete search history.

(56) References Cited

U.S. PATENT DOCUMENTS

| | | | |
|---|---|---|---|
| 6,847,300 B2 | 1/2005 | Yee et al. | |
| 7,498,953 B2 | 3/2009 | Salser et al. | |
| 8,830,083 B2 | 9/2014 | LaFrance et al. | |
| 9,304,014 B2 | 4/2016 | Komati et al. | |
| 2008/0007192 A1* | 1/2008 | Williams | H03G 3/3047 318/471 |
| 2009/0249152 A1* | 10/2009 | Higeta | H04L 1/1829 714/748 |
| 2010/0036624 A1 | 2/2010 | Martin et al. | |
| 2011/0047370 A1* | 2/2011 | Nagel | H04L 12/2836 713/150 |
| 2014/0265619 A1* | 9/2014 | Chau | E21B 47/125 307/104 |

(Continued)

*Primary Examiner* — Jay L Vogel
(74) *Attorney, Agent, or Firm* — Snyder, Clark, Lesch & Chung, LLP

(57) ABSTRACT

A method, a device, and a non-transitory storage medium are described in which a meter interface device may measure a temperature associated with the meter interface device, and use the measured temperature as a basis to regulate the transmission and the reception of data between the meter interface device and a wireless network. The meter interface device may also measure voltage, and use the measured voltage as a basis to regulate the transmission and the reception of data.

20 Claims, 12 Drawing Sheets

(56) References Cited

U.S. PATENT DOCUMENTS

| | | | |
|---|---|---|---|
| 2015/0086455 A1* | 3/2015 | Kruse | F01N 3/2006 |
| | | | 423/212 |
| 2015/0105932 A1* | 4/2015 | Hunt | H04L 47/25 |
| | | | 700/300 |
| 2015/0233731 A1 | 8/2015 | Torpy et al. | |
| 2016/0127878 A1* | 5/2016 | Clarke | H04W 4/021 |
| | | | 705/324 |
| 2016/0146892 A1* | 5/2016 | Lee | G01R 31/3835 |
| | | | 324/427 |
| 2016/0309420 A1* | 10/2016 | Verma | H04L 1/0034 |
| 2017/0021680 A1* | 1/2017 | Patterson | B60C 23/008 |
| 2017/0060202 A1* | 3/2017 | Sundaram | G06F 1/3275 |
| 2017/0078965 A1* | 3/2017 | Chen | H04W 12/0401 |
| 2017/0131117 A1 | 5/2017 | Torpy et al. | |
| 2017/0149614 A1* | 5/2017 | Zheng | H04L 63/101 |
| 2017/0164072 A1* | 6/2017 | Tsujita | B60C 23/04 |
| 2018/0248573 A1* | 8/2018 | Kojima | H04B 1/711 |
| 2019/0143915 A1* | 5/2019 | Lei | H04W 4/40 |
| | | | 701/29.2 |

* cited by examiner

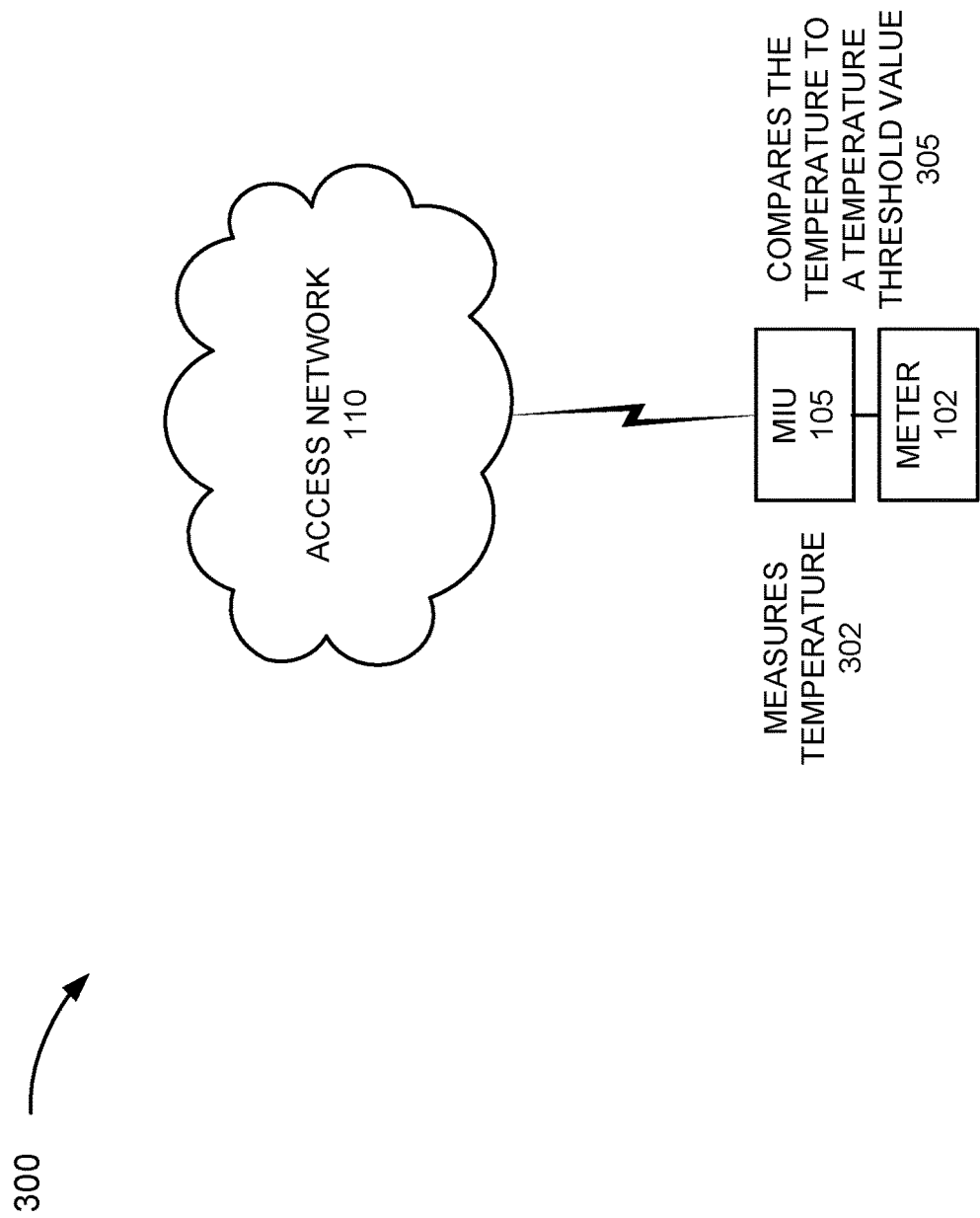

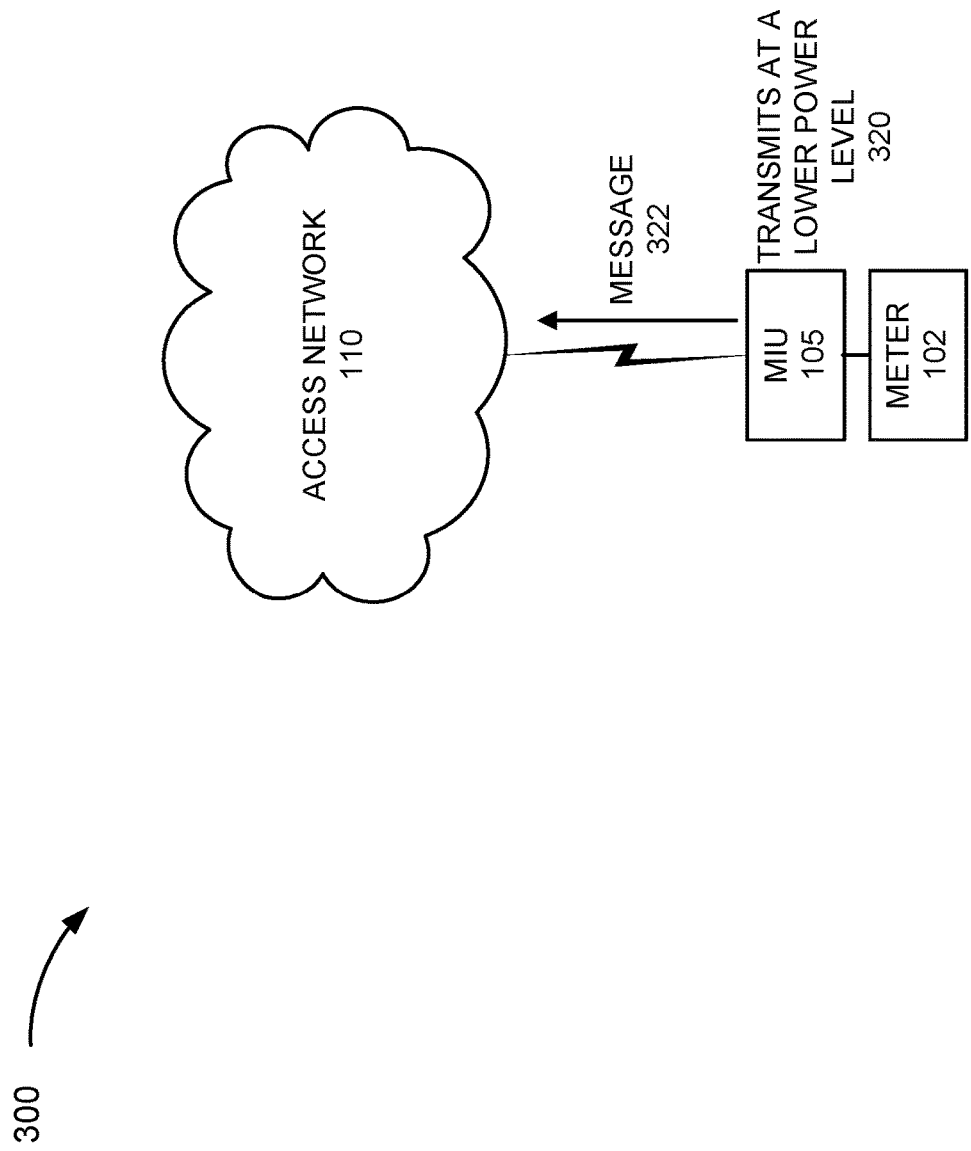

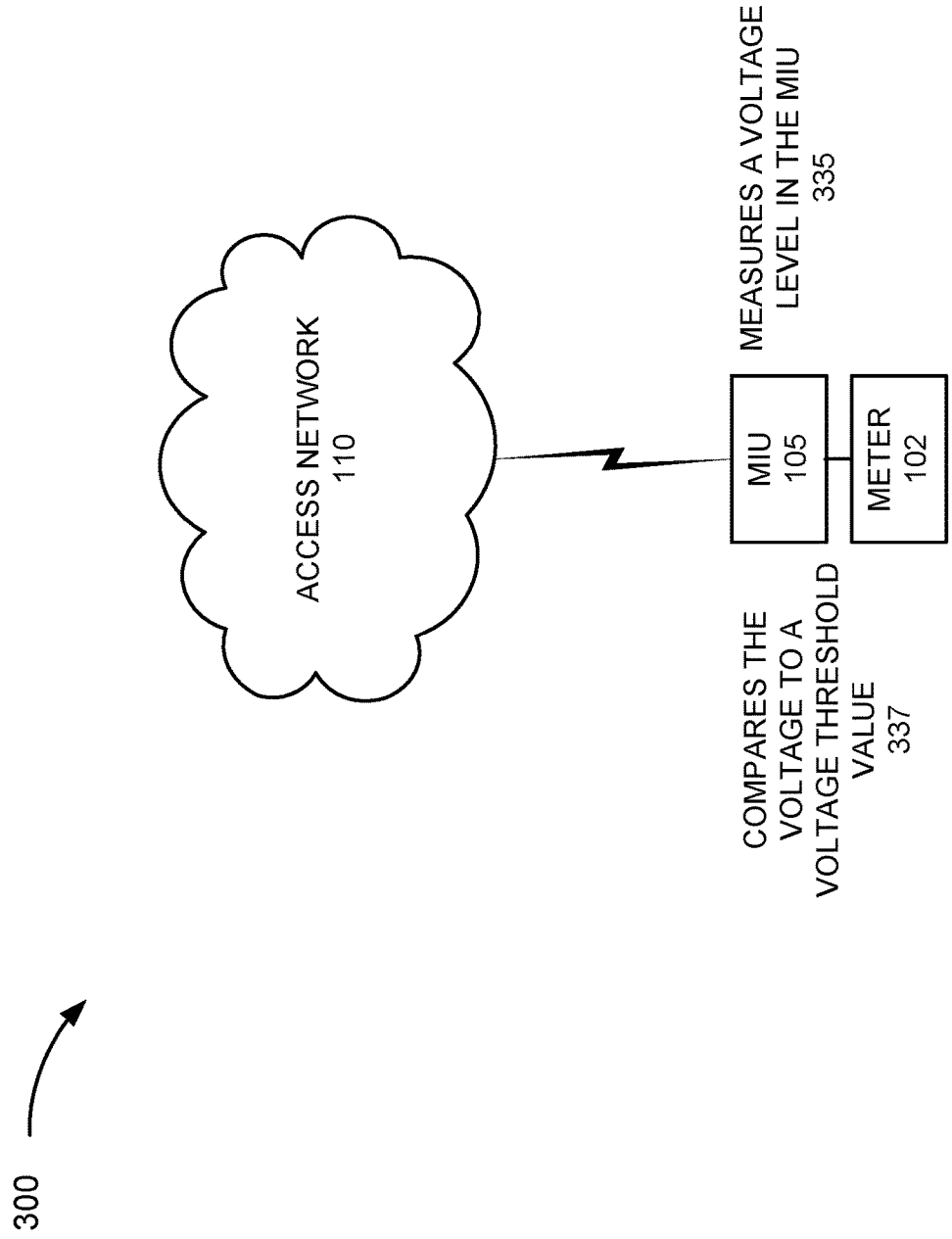

ENVIRONMENTAL SENSOR-BASED RADIO TRANSMITTER OF A UTILITY METER SYSTEM

CROSS-REFERENCE TO RELATED APPLICATION

The present application claims priority to U.S. Provisional Patent Application No. 62/699,349 filed Jul. 17, 2018, the entirety of which is hereby incorporated by reference herein.

BACKGROUND

Utility companies and other entities operate distribution systems for various resources (e.g., water, gas, electricity, chemicals, etc.) to deliver these resources to customers connected to the distribution systems. A meter may be used at each point the resource is removed and/or provided from the distribution system to a customer to measure usage. Many metering systems use wireless communications to report meter readings to a backend system via a communication network. The communication network may include network devices that can transmit and receive data.

BRIEF DESCRIPTION OF THE DRAWINGS

FIGS. 3A-3G are diagrams illustrating exemplary processes of exemplary embodiments of the temperature service according to various exemplary scenarios;

DETAILED DESCRIPTION OF PREFERRED EMBODIMENTS

Figure 1:
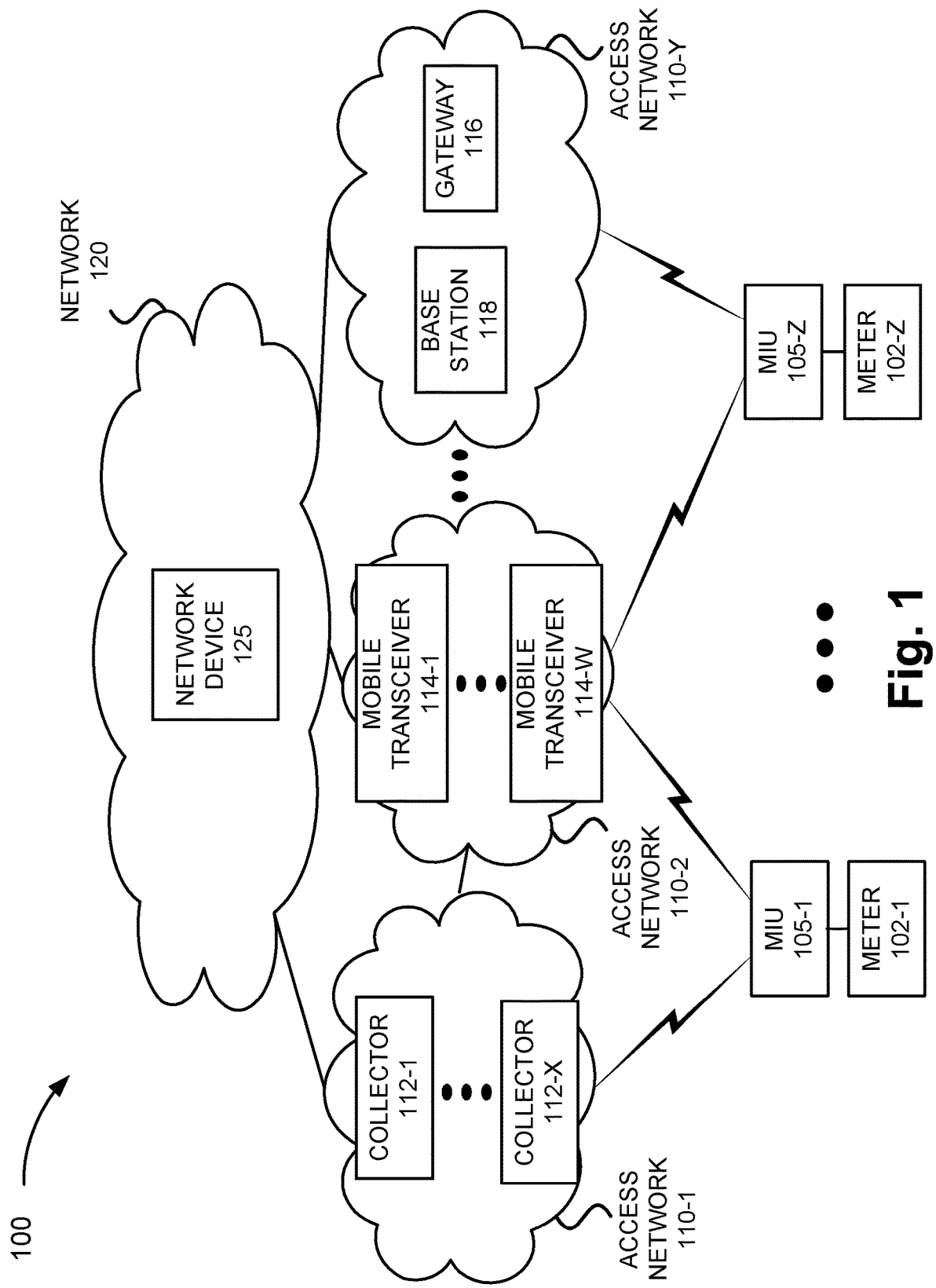
FIG. 1 is a diagram illustrating an exemplary environment in which an exemplary embodiment of a temperature service may be implemented.

The following detailed description refers to the accompanying drawings. The same reference numbers in different drawings may identify the same or similar elements. Also, the following detailed description does not limit the invention.

Meters that measure usage of a resource, such as a utility resource (e.g., water, gas, electricity, etc.) or another type of resource (e.g., chemical, etc.) are widely used. Further, meters have been combined with electronic components to facilitate communication between the meters and backend systems via a network. For example, a meter interface unit (MIU) may include a transmitter that is configured to wirelessly transmit water usage information and other information (e.g., leak information, reverse flow detection, etc.). The MIU may also include a receiver that is configured to wirelessly receive information and commands. The meter and the MIU may be a part of an automated meter reading (AMR) system, such as an AMR system associated with a water utility company.

The MIU may use one or multiple networks for communication. For example, the MIU may transmit information to a mobile transceiver of a wireless network. The mobile transceiver may be implemented as a handheld device, which may be operated by a user (e.g., an employee of a utility company). Alternatively, for example, the mobile transceiver may be implemented as a vehicle mount to a utility vehicle that is used to communicate with MIUs. Additionally, or alternatively, the MIU may communicate with a network device of a fixed network or a proprietary network of an entity (e.g., a utility company). For example, the network device (e.g., often referred to as "gateway" or a "collector") may be physically situated in proximity to the MIU. The mobile transceiver and the network device may be managed by the entity (e.g., a water utility company) of the AMR system.

When the MIU is situated in an outdoor environment, the MIU is subject to the environmental conditions of its location. For example, the MIU may be located on a side of a house or a building or in a pit below ground level. Unfortunately, depending on the environmental conditions, the MIU may not reliably operate. For example, a radio transceiver may not reliably operate beyond a certain ambient temperature because the ambient temperature may negatively impact the accuracy of the transmitter frequency source, other circuit components, and/or a power source (e.g., a battery, a capacitor, etc.). As a result, the MIU may experience unsuccessful data transmissions/receptions, a brownout in voltage, and other types of problems that may flow therefrom.

According to exemplary embodiments, the MIU includes logic that provides a temperature service. According to an exemplary embodiment, the MIU includes a temperature sensor that measures temperature. According to an exemplary embodiment, the temperature service may use a temperature reading from the temperature sensor to manage an operation of the MIU.

According to an exemplary embodiment, the temperature sensor may be configured to detect the temperature based on a schedule. For example, the schedule may be based on the season, the month, the day, the time of day, and/or another parameter. According to various exemplary implementations, the schedule may be static or dynamic. For example, in view of the unpredictability of weather, a previous temperature reading may be used as a basis for determining when a next temperature reading is to be performed. Additionally, or alternatively, the occurrence of a threshold number of unsuccessful transmissions and/or receptions of data may serve as a basis to measure the temperature. According to yet another example, the schedule may be based on an operational profile of the MIU. For example, some meters/MIUs may transmit data normally once a day versus every three (3) or (4) hours. In this regard, the schedule for measuring temperature may be different based on this operational characteristic.

According to an exemplary embodiment, the temperature service compares the temperature reading to a temperature threshold value. The temperature threshold value may relate to a low temperature (e.g., extreme cold) or a high temperature (e.g., extreme heat). The temperature threshold value may also relate to other criteria, such as the age of the MIU or a component thereof (e.g., a battery, etc.). Additionally, for example, the temperature threshold value may be a single temperature value or a range of temperatures values (e.g., between X temperature value and Y temperature value) specified in Celsius, Fahrenheit, or another metric. The temperature threshold value may be configured at the time of manufacturer of the MIU and/or prior or during installation of the MIU. The temperature threshold value may also be updated (e.g., a utility technician, receipt of a network command from an access network, etc.).

Based on a result of the comparison, the temperature service determines whether the temperature threshold value is satisfied. When it is determined that the temperature threshold value is satisfied, the MIU may continue to operate in a normal manner. When it is determined that the temperature threshold value is not satisfied, the temperature service may cause the MIU to operate in a manner different from when the temperature threshold value is satisfied. According to an exemplary embodiment, the MIU may transmit data at a power that is lower than normal. In this way, the demand on the power source may be reduced in extreme conditions. According to another exemplary embodiment, the MIU may prevent the transmission and/or the reception of data. According to yet another exemplary embodiment, the MIU may prevent or allow the transmission and/or the reception of data depending on a characteristic of the data to be transmitted and/or received. For example, the characteristic of the data may relate to the size or the amount of data, the priority or criticality of the data, or the content of the data (e.g., meter usage data versus a firmware update).

According to still another exemplary embodiment, the MIU may transmit at a higher data rate (e.g., relative to a normal data rate) so as to reduce the time period of transmission of data. According to yet another exemplary embodiment, the MIU may transmit a message to another network device (e.g., backend system, a network device of an access network, a host, etc.). According to one exemplary implementation, the message may include an alert that indicates that the MIU is unable to operate normally. Additionally, or alternatively, the message may include the measured temperature value. Additionally, or alternatively, for example, the message may indicate that the MIU is going to start operating in a different mode due to the temperature. In response to receiving the message, the other network device may restrict certain types of communications (e.g., reprogramming of the MIU, or another type of data transmission (e.g., low priority, etc.)) while the MIU operates in the different mode.

According to yet other exemplary embodiments, the MIU may select a particular response based on the age of the MIU and/or a component of the MIU. For example, if the battery of the MIU is near its life expectancy, the MIU may select one available response (e.g., not transmit and not receive data) over another available response (e.g., transmit data at a higher bit rate).

According to an exemplary embodiment, the MIU may reschedule or delay a transmission and/or a reception of data to a future time period when the transmission and/or the reception of data is not allowed. For example, according to an exemplary implementation, the MIU may be pre-configured with a schedule for transmitting and/or receiving data. According to such an implementation, the MIU may wait for a next time window during which the MIU is scheduled to transmit and/or receive data to transmit and/or receive the data not previously transmitted and/or received. According to other exemplary implementations, the MIU may wait a pre-configured time period that has no relation to a pre-configured schedule.

According to another exemplary embodiment, when it is determined that the temperature threshold value is not satisfied, the MIU may check the voltage level in the MIU. For example, the MIU may compare the voltage level to a voltage threshold value. The voltage threshold value may be a single voltage value or a range of voltage values (e.g., between X voltage value and Y voltage value). Based on a result of the comparison, the MIU may determine whether the voltage threshold value is satisfied. When it is determined that the voltage threshold value is satisfied, the MIU may continue to operate in a normal manner. When it is determined that the voltage threshold value is not satisfied, the MIU may operate in a manner different from when the voltage threshold value is satisfied. For example, according to various exemplary embodiments, the MIU may transmit at a lower power, not transmit or receive data, and/or not transmit or receive certain data depending on the characteristic of the data, as previously described. Additionally, or alternatively, according to various exemplary embodiments, the MIU may transmit at a higher data rate, may transmit a message, and/or may select a response based on the age of the MIU, as previously described.

As a result, the MIU may improve communication between the MIU and, a network and/or an AMR system. For example, the temperature service may minimize unsuccessful transmissions and/or receptions of data, which in turn may improve resource utilization in the MIU. Additionally, the temperature service may extend the life of components of the MIU (e.g., circuitry, etc.) by limiting the operation of a component when the voltage/power is not compromised by the ambient temperature associated with the MIU. Additionally, the temperature service may improve resource utilization in the network by minimizing unsuccessful transmissions and/or receptions of data.

FIG. 1 is a diagram illustrating an exemplary environment 100 in which an exemplary embodiment of the services described herein may be implemented. As illustrated, environment 100 includes meters 102-1 through 102-Z, in which Z>1 (referred to collectively as meters 102 and individually (or generally) as meter 102) and MIUs 105-1 through 105-Z (referred to collectively as MIUs 105 and individually (or generally) as MIU 105). Environment 100 further includes access networks 110-1 through 110-Y, in which Y>1 (referred to collectively as access networks 110 and individually (or generally) as access network 110), and a network 120.

According to other embodiments, environment 100 may include additional networks and/or different types of networks than those illustrated and described herein. The number, the type, and the arrangement of devices in access networks 110 and network 120 are exemplary. The number and the arrangement of meters 102 and MIUs 105 are exemplary.

Environment 100 may include communication links between various network devices and networks. Additionally, MIUs 105 and devices of access networks 110 may establish communication links. The number, the type, and the arrangement of communication links illustrated in environment 100 are exemplary.

Meter 102 may include a device that is configured to measure usage of a resource. For example, meter 102 may be a water meter or another type of meter, as previously described. Various implementations of meter 102 may use different measurement technologies (e.g., ultrasonic sensing, magnetic-sensing, positive displacement, etc.) to measure usage of the particular resource, such as water, and so forth.

MIU 105 may include an electronic device that collects, analyzes, and stores data from meter 102. According to one exemplary implementation, MIU 105 may be integrated into meter 102. According to another exemplary implementation, MIU 105 (or portion thereof) may be a separate component from meter 102. For example, the separate component may be communicatively coupled to meter 102 (or a remaining portion of MIU 105) via a cable or another type of connector. According to an exemplary implementation, MIU 105 may include a wireless transmitter and a wireless receiver for communication. MIU 105 may be configured to access and use multiple access networks 110. According to an exemplary embodiment, MIU 105 includes a component that provides the temperature service, as described herein. MIU 105 is described further below.

Access networks 110 may include multiple wireless networks that may support multiple wireless (e.g., radio) technologies. For example, access network 110-1 may include a fixed wireless network, which includes collectors 112-1 through 112-X, in which X>1 (referred to collectively as collectors 112 and individually (or generally) as collector 112). Access network 110-1 may support an AMR system. Access network 110-1 may be a proprietary wireless network (e.g., owned and operated by a utility company (e.g., a water utility company, etc.)). Collector 112 may include a network device that is configured to receive, analyze, and store data from MIU 105, such as water usage information. Collector 112 may also transmit data to MIU 105 and may communicate with a backend system (e.g., network device 125 of network 120). Access network 110-1 may operate in a "one-way" communication mode, a "two-way" communication mode, or a combination of both in relation to MIU 105 and collector 112, as well in relation to collector 112 and the backend system.

Access network 110-2 may include a mobile transceivers network, as previously described, which includes mobile transceivers 114-1 through 114-W (referred to collectively as mobile transceivers 114 and individually (or generally) as mobile transceiver 114). Access network 110-2 may support an AMR system. Mobile transceiver 114 may include a network device that is configured to receive and store data from MIU 105. As previously described, mobile transceiver 114 may be implemented as a mobile or handheld user device (e.g., operated by a user or a technician associated with a utility company, such as a water company), a vehicle mounted device, or another suitable mobile device (e.g., a drone that communicates with MIU 105, etc.). Mobile transceiver 114 may also be configured to communicate with the backend system (e.g., network device 125). Mobile transceiver 114 may operate in one or multiple communication modes (e.g., one-way, two-way, etc.). According to some exemplary implementations, mobile transceiver 114 may also connect to MIU 105 via a wired connection and/or another suitable communication medium (e.g., infrared, optical, etc.). For example, a utility employee/technician may connect a mobile device (e.g., a tablet, a handheld device, etc.) to MIU 105 via a cable or other suitable connector.

Access network 110-Y may include a wireless network. According to an exemplary embodiment, access network 110-Y is a third party wireless network. For example, the phrase "third party" may be relative to a utility company and its customers (e.g., associated with meter 102 and MIU 105). That is, the third party wireless network may be provided and/or operated by an entity external from the utility company. Access network 110-Y may be implemented to include a Long Range Wide Area Network (LoRaWAN), a Sigfox Low Power WAN (LPWAN), an Ingenu machine network, an Evolved UMTS Terrestrial Radio Access Network (E-UTRAN) (e.g., a Fourth Generation RAN (4G RAN)), a 4.5G RAN, a next generation RAN (e.g., a 5G-access network), a Worldwide Interoperability for Microwave Access (WiMAX) network, and/or a public land mobile network (PLMN). Access network 110-Y may also include a complementary core network of the RAN (e.g., Evolved Packet Core Network, a 5G Core network, etc.). Depending on the implementation, access network 110-Y may include various types of wireless nodes, such as, for example, a base station 118, a gateway 116, as well as other types of wireless nodes not illustrated (e.g., evolved Node B (eNB), a next generation Node B (gNB), an evolved Long Term Evolution (eLTE) eNB, a small cell device, etc.).

Access network 110-Y may include a wired network. According to such an exemplary embodiment, MIU 105 may not wirelessly communicate (directly) with access network 110-Y. However, collector 112 may communicate with network device 125 and/or MIU 105 via access network 110-Y. Access network 110-Y may be implemented to include other types of networks, such as the Internet, a WAN, a metropolitan area network (MAN), a data transport network, a backhaul network, and/or other type of wired/wireless network.

Network 120 may include a network that provides access to and hosts network device 125. For example, network 120 may be implemented to include a WAN, the Internet, an Intranet, an Internet Protocol (IP) network, a wired network, a wireless network, a private network, and/or another suitable network. Network device 125 includes a device that may be configured to aggregate and process the data received from access networks 110 and MIUs 105. For example, network device 125 may be implemented to include a server device and a data management system. Additionally, for example, network device 125 may be maintained by a utility company or another entity associated with meters 102 and MIUs 105. Network device 125 may include a system that generates customer bills based on the processed meter usage data, such as the amount of water used over a period of time.

Figure 2:
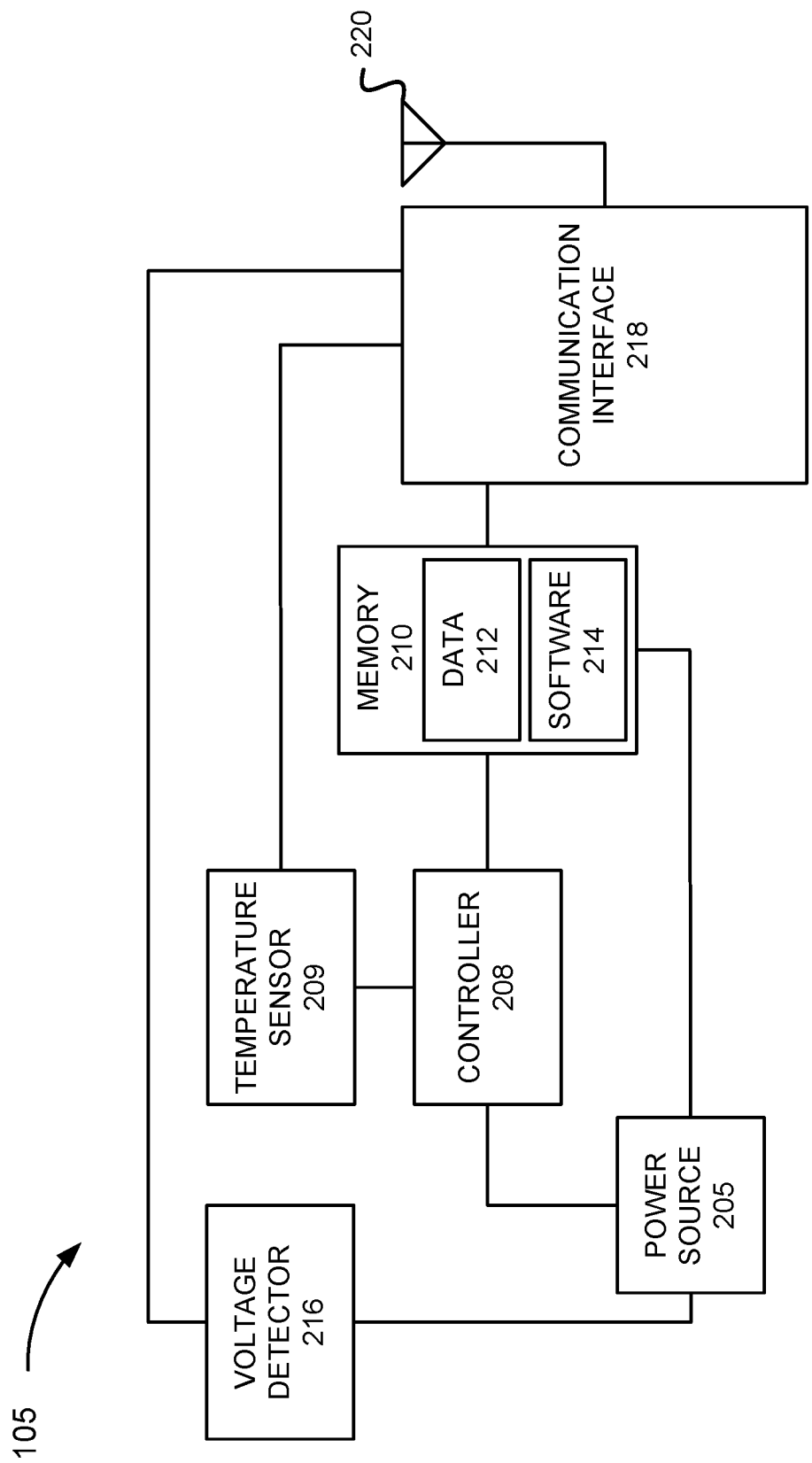
FIG. 2 is a diagram illustrating exemplary components of an exemplary embodiment of a meter interface unit (MIU) depicted in FIG. 1.

FIG. 2 is a diagram illustrating exemplary components of an exemplary embodiment of MIU 105. As illustrated, MIU 105 may include a power source 205, a controller 208, a temperature sensor 209, a memory 210, a voltage detector 216, a communication interface 218, and an antenna 220. According to other embodiments, MIU 105 may include fewer components, additional components, different components, and/or a different arrangement of components than those illustrated in FIG. 2 and described herein. For example, according to another exemplary embodiment, MIU 105 may not include voltage detector 216. Additionally, for example, although not illustrated, MIU 105 may include a meter interface. The meter interface may physically or wirelessly connect MIU 105 to meter 102 and allow MIU 105 to detect or receive meter usage data.

The connections between components depicted in FIG. 2 are exemplary. According to other exemplary embodiments, there may be additional, fewer, and/or different connections between the components.

Power source 205 may include a battery or another suitable source for electrical current, such as a local power grid, a local generator (e.g., a photoelectric generator, etc.), and so forth.

Controller 208 may include a processor. For example, controller 208 may include a central processing unit (CPU) (e.g., one or multiple cores), a microprocessor, an application specific integrated circuit (ASIC), a programmable logic device (e.g., a field programmable gate array (FPGA), etc.), a system-on-chip (SoC), a microcontroller, and/or another type of component that interprets and/or executes instructions and data.

Temperature sensor 209 may include a sensor that detects temperature. According to an exemplary implementation, the temperature may correspond to an ambient temperature associated with MIU 105, such as the air temperature of the environment in which MIU 105 is located. According to another exemplary implementation, the temperature may correspond to a temperature of a component of MIU 105. For example, the component may be communication interface 218 or a sub-component of communication interface 218 (e.g., an element of a radio frontend, the radio frontend, etc.). According to other examples, the component may be power source 205 and/or some other component/sub-component of MIU 105. According to some exemplary implementations, temperature sensor 209 may be a smart sensor. Temperature sensor 209 may output a Celsius temperature value, a Fahrenheit temperature value, a voltage that may be converted into a temperature value, or another type of value. Additionally, or alternatively, temperature sensor 209 may be interrogated via a port to obtain a value representative of a temperature.

Memory 210 may include various types of memory. For example, memory 210 may include a random access memory (RAM), a dynamic random access memory (DRAM), a static random access memory (SRAM), a ferroelectric RAM, a cache, a read only memory (ROM), a programmable read only memory (PROM), an erasable PROM (EPROM), an electrically EPROM (EEPROM), a flash memory, and/or another type of memory.

As illustrated, memory 210 may store data 212 and software 214. Data 212 may include various type of information that support the operation of meter 102/MIU 105. For example, data 212 may include product information (e.g., an MIU identifier, a lot number, a manufacturer date, etc.), configuration information (e.g., network credentials, etc.), meter data pertaining to meter 102, data received from access network 110/network device 125, and so forth. According to some exemplary implementations, memory 210 may store a temperature value. The temperature value may be a current temperature value and/or a historical temperature value. According to an exemplary implementation, memory 210 stores a temperature threshold value. Additionally, for example, memory 210 may store a voltage threshold value.

Software 214 includes an application, a program, or another form of instructions that provides a function and/or a process. As an example, software 214 may include instructions that, when executed by controller 208, provides the functions of the temperature service, as described herein. Additionally, as another example, software 214 may include instructions that, when executed by controller 208, provides the functions of an AMR service. Software 214 may also include firmware, middleware, microcode, hardware description language (HDL), and/or another form of instructions. Software 214 may further include an operating system (OS).

Voltage detector 216 may include a circuit that detects a voltage. For example, voltage detector 216 may detect an undervoltage condition. Voltage detector 216 may detect the voltage in relation to a component of MIU 105. For example, the component may be communication interface 218 or a sub-component of communication interface 218 (e.g., an element of a radio frontend, the radio frontend, etc.). According to other examples, the component may be power source 205 and/or some other component/sub-component of MIU 105. Voltage detector 216 may perform other voltage-related functions (e.g., low-battery detection, power-supply fault monitoring, over voltage protection, etc.). According to some exemplary embodiments, voltage detector 216 may be a separate element from a voltage detector that may be incorporated with controller 208. For example, some processors, microprocessors, etc., may include a programmable voltage detection circuit.

Communication interface 218 may include a transmitter and a receiver. Communication interface 218 may operate according to a protocol stack and a communication standard. Communication interface 218 may include various processing logic or circuitry that may provide a function (e.g., multiplexing/de-multiplexing, filtering, amplifying, digital/analog converting, error correcting, modulating/de-modulating, etc.). Antenna 220 may include an antenna that receives and transmits wireless signals. For example, antenna 220 may include a dipole antenna, a low-profile antenna, or another type of antenna that is capable of operating in a desired frequency band.

According to some exemplary embodiments, MIU 105 may be synchronized to a schedule based on a real-time clock (not illustrated) of MIU 105. The real-time clock may not be synchronized to a clock of any external device, but in some embodiments, a wireless network (e.g., via collector 112 or mobile transceiver 114) may periodically update or correct the time of MIU's 105 clock. At scheduled intervals, controller 208 may wake up and check a table (or another type of data structure) that identifies what actions are scheduled to occur at that time. Controller 208 may then cause a variety of actions to occur, such as, for example, interrogating meter 102 for its data, transmitting data, receiving data, and so forth. MIU 105 may also perform operations that may be unscheduled, such as data transmissions relating to an alarm, performing an operation in response to receiving a command from a network, and so forth.

Figure 3B:
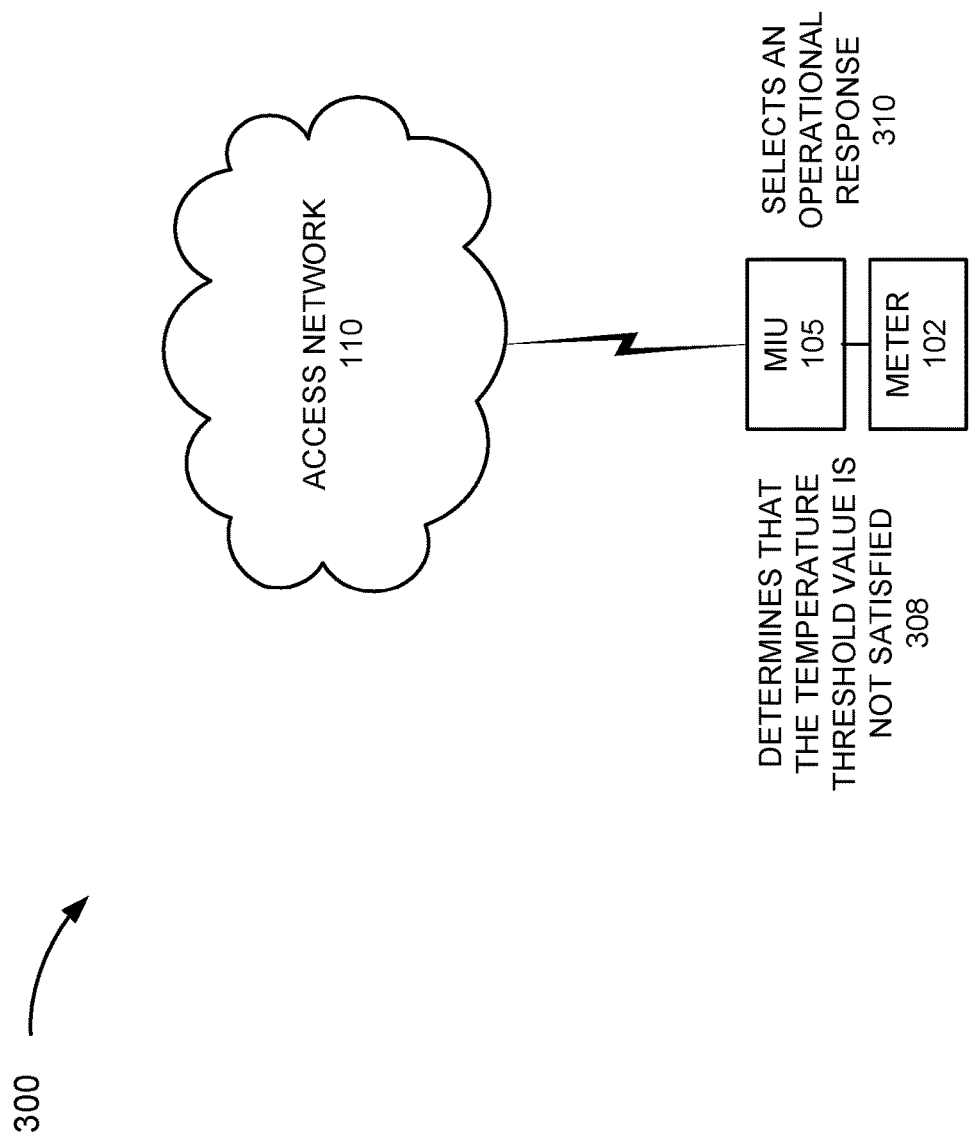

FIGS. 3A-3G are diagrams illustrating exemplary processes of the temperature service according to various exemplary scenarios. Referring to FIG. 3A, according to an exemplary process, assume that temperature sensor 209 may be triggered to measure a temperature. For example, the trigger may relate to a schedule or some other event, as previously described. In response to this event, temperature sensor 209 may measure a temperature 302. The measured temperature may indicate an ambient temperature, a temperature of a component or sub-component included in MIU 105, as previously described. Additionally, temperature sensor 209 may measure one or multiple temperatures. The measured temperature value may be logged (e.g., in memory 210).

In response to obtaining the temperature, MIU 105 may compare the temperature to a temperature threshold value 305. For example, MIU 105 may store one or multiple temperature threshold values in memory 210. Referring to FIG. 3B, based on the result of the comparison, MIU 105 may determine whether the temperature threshold value is satisfied. According to this exemplary scenario, assume that the temperature threshold value is not satisfied 308. For example, the temperature may be below the temperature threshold value.

In response to determining that the temperature threshold value is not satisfied, MIU 105 may select an operational response 310. For example, according to various exemplary embodiments, MIU 105 may transmit at a lower power, not transmit or receive data, and/or not transmit or receive certain data depending on the characteristic of the data, as previously described. Additionally, or alternatively, according to various exemplary embodiments, MIU 105 may transmit at a higher data rate, may transmit a message (e.g., an alert, temperature-related information, change in operational mode, etc.), and/or may select a response based on the age of MIU 105, as previously described.

According to various exemplary implementations, the proximity in time for selecting and executing the operational response may vary relative to the transmission and/or reception of data by MIU 105. For example, according to some exemplary implementations, the timing of the triggering event to measure temperature may be configured in temporal alignment with a schedule for transmissions and receptions of data. According to other exemplary implementations, the timing of the triggering event to measure temperature may occur not in close temporal proximity to a scheduled or unscheduled transmission and/or reception of data. In this regard, the execution and the enforcement of the selected response may be assigned a time window that is configurable in terms of length. For example, the time window may be configured as a certain number of minutes, hours, days, or another time period. Additionally, or alternatively, the time window may be configured upon the occurrence of an event. For example, the event may be the invocation of a temperature measurement. In this regard, if a scheduled or unscheduled transmission and/or a reception should occur within the time window, the transmission and/or the reception of data may adhere to the selected operational response.

According some exemplary implementations, upon expiration of the time window, MIU 105 may return to a mode of operation corresponding to a mode when the temperature threshold value is satisfied. Additionally, or alternatively, the MIU 105 may make a subsequent temperature measurement before returning to the mode of operation (e.g., a normal mode).

According to some exemplary implementations, MIU 105 may store the measured temperature (e.g., in memory 210), when it does not satisfy the temperature threshold value. MIU 105 may subsequently use this information as a basis for determining whether to make the subsequent temperature measurement and/or return to the normal mode of operation. For example, when a difference between the measured temperature and the temperature threshold value is minimal (e.g., about a few degrees or some other configurable amount) and a sufficient time period has transpired from the previous temperature measurement, MIU 105 may determine to forego another temperature measurement.

Figure 3D:
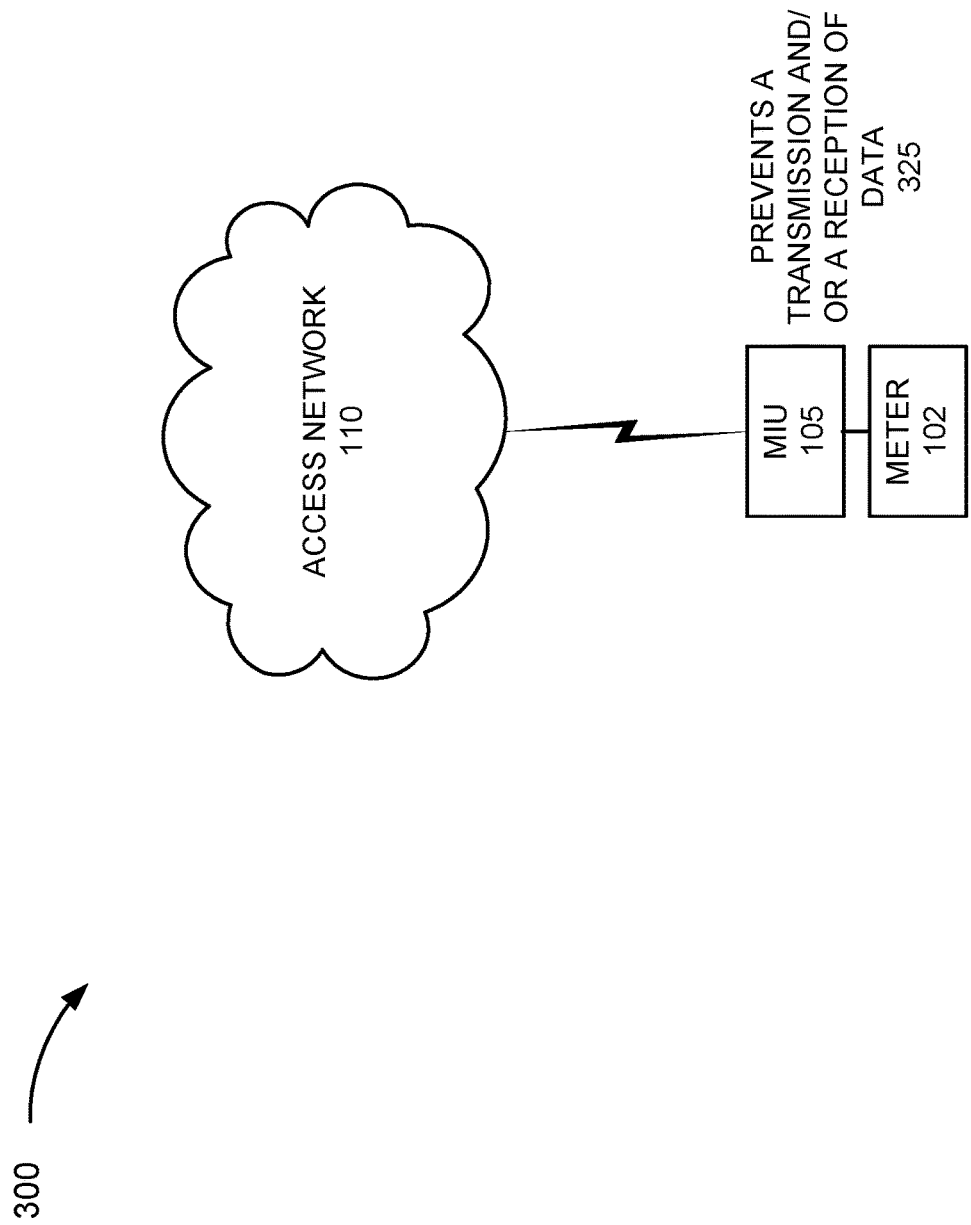

Referring to FIG. 3C, as previously described, according to an exemplary embodiment, the selection and execution of the operational response may include transmitting at a lower power level 320. For example, MIU 105 may transmit a message 322 to access network 110 at a lower power level than a (normal) power level that message 322 would be transmitted if the temperature had satisfied the temperature threshold value. The amount of reduction of the power level may be a static value or a dynamic value. For example, the amount of reduction of the power level may depend on the difference in temperature of the measured temperature relative to the threshold temperature value. Referring to FIG. 3D, according to another exemplary embodiment, the selection and execution of the operational response may include preventing a transmission and/or a reception of data 325. For example, according to an exemplary implementation, MIU 105 may not activate (e.g., power on) communication interface 218.

Figure 3E:
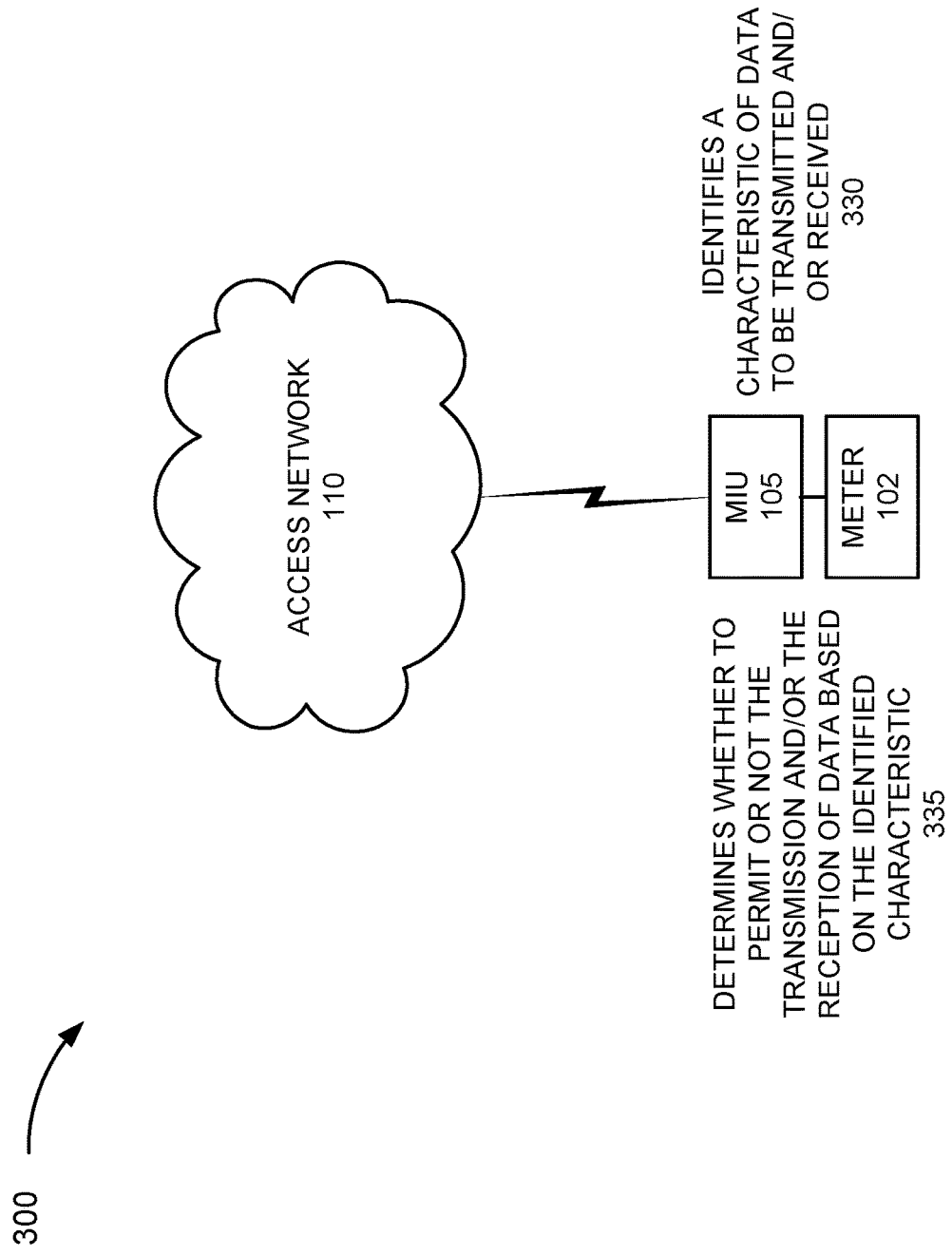

Referring to FIG. 3E, according to yet another exemplary embodiment, the selection and the execution of the operational response may include identifying a characteristic of data to be transmitted and/or received 330. For example, as previously described, MIU 105 may identify the size or the amount of data, the priority or criticality of the data, or the content of the data. For data to be received, MIU 105 may store data indicating the type of data to be received during a reception window. For example, an operational profile of MIU 105 and/or a schedule for transmissions and/or receptions of data may indicate the type of data involved (e.g., meter usage information; internal clock synchronization with network; etc.). According to some exemplary implementations, MIU 105 may identify the characteristic of data for only transmissions.

As further illustrated in FIG. 3E, MIU 105 may determine whether to permit or not permit the transmission and/or the reception of data based on the identified characteristic 335. For example, MIU 105 may prevent the transmission and/or the reception of data when the amount of data is large. According to another example, MIU 105 may permit the transmission and/or the reception of data when the data is critical or of a particular level of priority (e.g., an overdue meter reading for water usage information).

Additionally, or alternatively, according to other exemplary embodiments, MIU 105 may transmit at a higher data rate (e.g., to reduce the time period of transmission and use of power (e.g., battery)), may transmit a message (e.g., an alert, the measured temperature value, change in operational mode, etc.), and/or may select a response based on the age of MIU 105, as previously described.

Figure 3G:
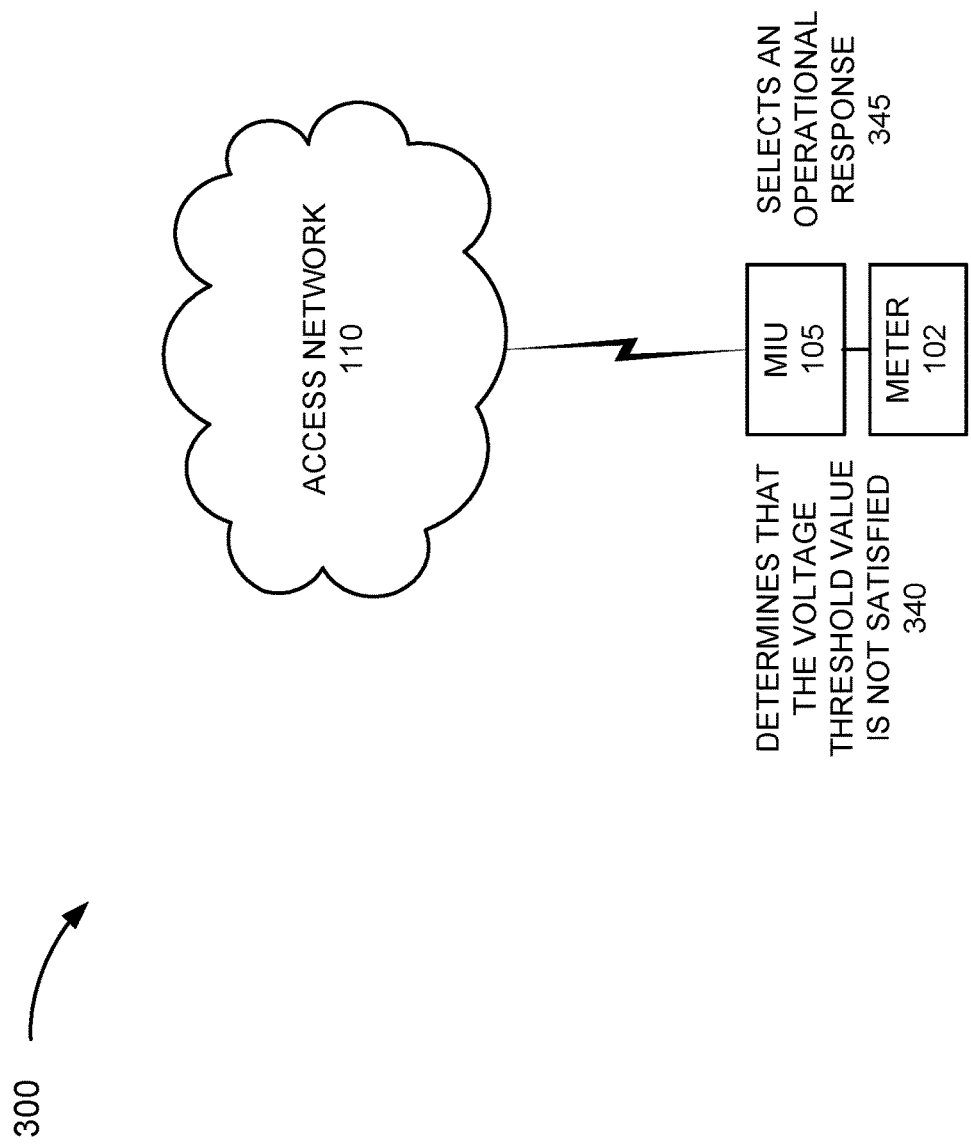

Referring to FIGS. 3F and 3G, according to still another exemplary embodiment, in response to determining that the temperature threshold value is not satisfied, voltage detector 216 may measure a voltage level in the MIU 335. For example, the voltage level may pertain to a component of MIU 105 or a sub-component of a component of MIU 105, as previously described. The voltage level value may be logged (e.g., in memory 210).

In response to obtaining the voltage, MIU 105 may compare the voltage to a voltage threshold value 337. For example, MIU 105 may store one or multiple voltage threshold values in memory 210. Referring to FIG. 3G, based on the result of the comparison, MIU 105 may determine whether the voltage threshold value is satisfied. According to this exemplary scenario, assume that MIU 105 determines that the voltage threshold value is not satisfied 340. For example, assume that an under-voltage condition exists. In response to this determination, MIU 105 may select an operational response 345. For example, according to various exemplary embodiments, MIU 105 may transmit at a lower power, not transmit or receive data, and/or not transmit or receive certain data depending on the characteristic of the data, as previously described. Additionally, or alternatively, according to various exemplary embodiments, MIU 105 may transmit at a higher data rate, may transmit a message, and/or may select a response based on the age of MIU 105, as previously described.

Although FIGS. 3A-3G illustrate exemplary process of the temperature service, according to other exemplary embodiments, the processes may include additional, different, and/or fewer steps/operations than those illustrated and described.

Figure 4:
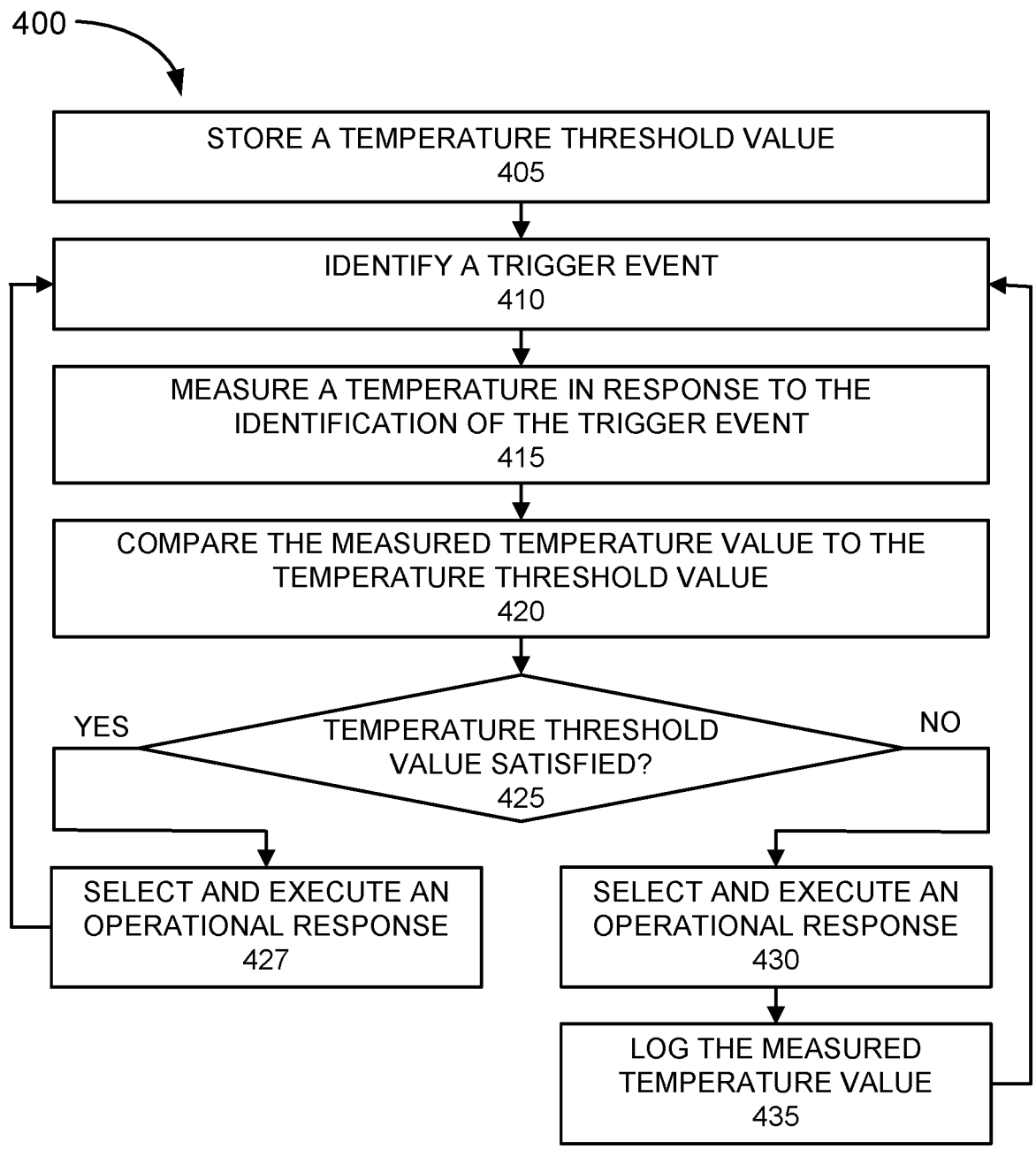
FIG. 4 is a flow diagram illustrating an exemplary process of an exemplary embodiment of the temperature service.

FIG. 4 is a flow diagram illustrating an exemplary process 400 of an exemplary embodiment of the temperature service. According to an exemplary embodiment, MIU 105 performs steps of process 400. For example, controller 208 may execute software 214 to perform a step illustrated in FIG. 4, and described herein. Alternatively, another component of MIU 105 (e.g., temperature sensor 209, memory 210, etc.) may perform the step.

Referring to FIG. 4, in block 405, a temperature threshold value may be stored. For example, memory 210 may store one or multiple temperature threshold values. The temperature threshold value may relate to an ambient temperature, a temperature for a component, a temperature for a sub-component, as previously described. Additionally, for example, the temperature threshold value may relate to a high temperature or a low temperature.

In block 410, a trigger event may be identified. For example, MIU 105 may identify a trigger event that relates to the temperature service. For example, as previously described, the trigger event may relate to a schedule, a condition (e.g., a threshold number of unsuccessful transmissions and/or receptions of data, etc.), an operational profile of MIU 105, etc.

In block 415, a temperature may be measured in response to the identification of the trigger event. For example, temperature sensor 209 may measure a temperature.

In block 420, the measured temperature value may be compared to the temperature threshold value. For example, MIU 105 may select the temperature threshold value (e.g., from memory 210) and compare the measured temperature value to the selected temperature threshold value.

In block 425, it is determined whether the temperature threshold value is satisfied. For example, MIU 105 may determine whether the temperature satisfies the temperature threshold value based on the comparison of the measured temperature value and the temperature threshold value. By way of further example, when the measured temperature is below a temperature threshold value (e.g., directed to low temperatures), MIU 105 may determine that the temperature threshold value is not satisfied. Alternatively, for example, when the measured temperature is above a temperature threshold value (e.g., directed to high temperatures), MIU 105 may determine that the temperature threshold value is not satisfied. According to yet another example, when the measured temperature is within a range of the temperature threshold value, MIU 105 may determine that the temperature threshold value is satisfied.

When it is determined that the temperature threshold value is satisfied (block 425—YES), MIU 105 may select and execute an operational response (block 427). For example, MIU 105 may carry out any operations that would be performed when the temperature is satisfactory. By way of further example, depending on the context, MIU 105 may transmit and/or receive data to/from access network 110. Alternatively, MIU 105 may perform other scheduled and/or non-scheduled operations that are configured under normal operational conditions. As, further illustrated, process 400 may return to block 410. For example, MIU 105 may wait for a next trigger event to occur, and when it occurs, identify the trigger event.

When it is determined that the temperature threshold value is not satisfied (block 425—NO), MIU 105 may select and execute an operational response (block 430). For example, MIU 105 may select and execute the operational response, such as transmit at a lower power, not transmit or receive data, and/or not transmit or receive certain data depending on the characteristic of the data, as previously described. Additionally, or alternatively, according to various exemplary embodiments, MIU 105 may transmit at a higher data rate, may transmit a message, and/or may select a response based on the age of MIU 105, as previously described. As previously described, depending on the configuration of the temperature service, the execution and the enforcement of the selected operational response may be assigned a time window that is configurable in length.

In block 435, the measured temperature value may be logged. For example, MIU 105 may store the measured temperature value as historical data (e.g., as data 212). The historical data may be used for various purposes, as described herein.

Although FIG. 4 illustrates an exemplary process 400 of the temperature service, according to other embodiments, process 400 may include additional operations, fewer operations, and/or different operations than those illustrated in FIG. 4, and described herein. For example, according to other exemplary embodiments, block 435 may be omitted.

Figure 5A:
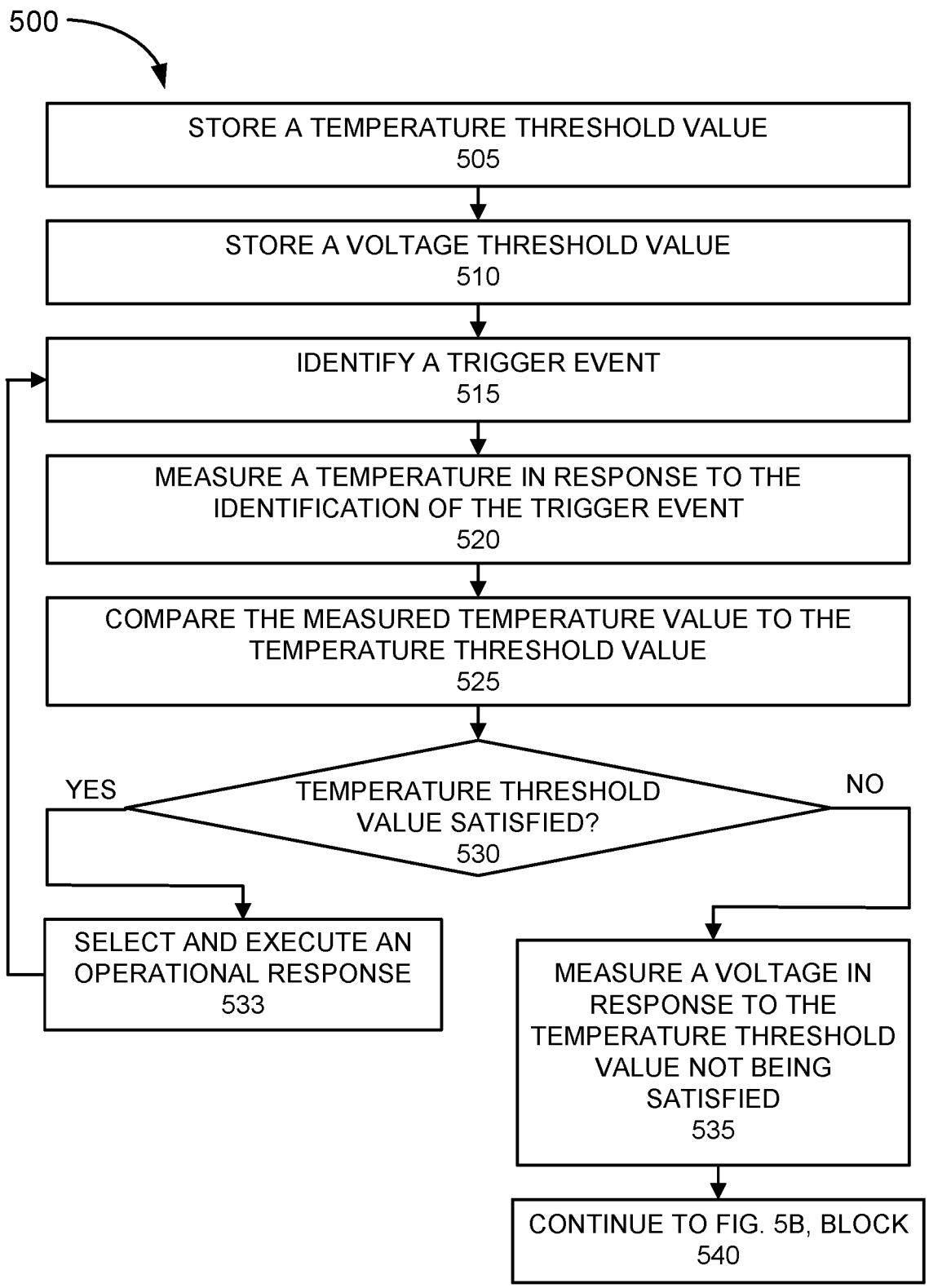
FIGS. 5A and 5B are flow diagrams illustrating another exemplary process of an exemplary embodiment of the temperature service.
Figure 5B:
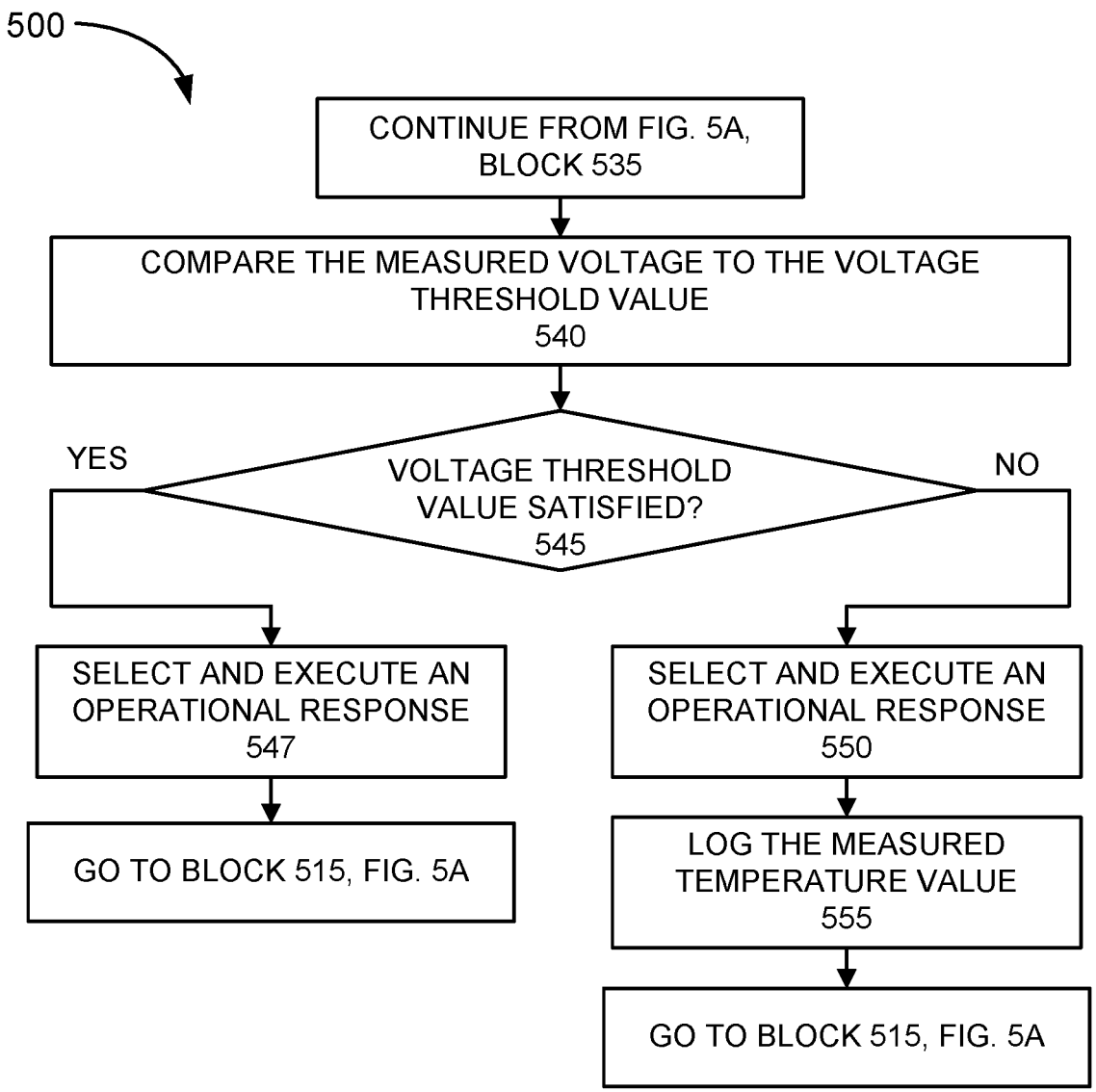

FIGS. 5A and 5B are flow diagrams illustrating an exemplary process 500 of another exemplary embodiment of the temperature service. According to an exemplary embodiment, MIU 105 performs steps of process 500. For example, controller 208 may execute software 214 to perform a step illustrated in FIG. 5A and/or 5B, and described herein. Alternatively, another component of MIU 105 (e.g., temperature sensor 209, memory 210, voltage detector 216, etc.) may perform the step.

Referring to FIG. 5A, in block 505, a temperature threshold value may be stored. For example, memory 210 may store one or multiple temperature threshold values. The temperature threshold value may relate to an ambient temperature, a temperature for a component, a temperature for a sub-component, as previously described. Additionally, for example, the temperature threshold value may relate to a high temperature or a low temperature.

In block 510, a voltage threshold value may be stored. For example, memory 210 may store one or multiple voltage threshold values. The voltage threshold value may relate to a low voltage associated with a component or a sub-component of MIU 105, as previously described.

In block 515, a trigger event may be identified. For example, MIU 105 may identify a trigger event that relates to the temperature service. For example, as previously described, the trigger event may relate to a schedule, a condition (e.g., a threshold number of unsuccessful transmissions and/or receptions of data, etc.), an operational profile of MIU 105, etc.

In block 520, a temperature may be measured in response to the identification of the trigger event. For example, temperature sensor 209 may measure a temperature.

In block 525, the measured temperature value may be compared to the temperature threshold value. For example, MIU 105 may select and read the temperature threshold value (e.g., from memory 210) and compare the measured temperature value to the selected temperature threshold value.

In block 530, it is determined whether the temperature threshold value is satisfied. For example, MIU 105 may determine whether the temperature satisfies the temperature threshold value based on the comparison of the measured temperature value and the temperature threshold value. By way of further example, when the measured temperature is below a temperature threshold value (e.g., directed to low temperatures), MIU 105 may determine that the temperature threshold value is not satisfied. Alternatively, for example, when the measured temperature is above a temperature threshold value (e.g., directed to high temperatures), MIU 105 may determine that the temperature threshold value is not satisfied. According to yet another example, when the measured temperature is within a range of the temperature threshold value, MIU 105 may determine that the temperature threshold value is satisfied.

When it is determined that the temperature threshold value is satisfied (block 530—YES), MIU 105 may select and execute an operational response (block 533). For example, MIU 105 may carry out any operations that would be performed when the temperature is satisfactory. By way of further example, depending on the context, MIU 105 may transmit and/or receive data to/from access network 110. Alternatively, MIU 105 may perform other scheduled and/or non-scheduled operations that are configured under normal operational conditions. As, further illustrated, process 500 may return to block 515. For example, MIU 105 may wait for a next trigger event to occur, and when it occurs, identify the trigger event.

When it is determined that the temperature threshold value is not satisfied (block 530—NO), a voltage may be measured in response to determining that the temperature threshold value is not satisfied (block 535). For example, voltage detector 216 may measure a voltage in relation to a component and/or sub-component of MIU 105.

Referring to FIG. 5B, in block 540, the measured voltage value may be compared to the voltage threshold value. For example, MIU 105 may select and read the voltage threshold value (e.g., stored in memory 210) and compare the measured voltage value to the selected voltage threshold value.

When it is determined that the voltage threshold value is satisfied (block 545—YES), MIU 105 may select and execute an operational response (block 547). For example, MIU 105 may carry out any operations that would be performed when the temperature is satisfactory. By way of further example, depending on the context, MIU 105 may transmit and/or receive data to/from access network 110. Alternatively, MIU 105 may perform other scheduled and/or non-scheduled operations that are configured under normal operational conditions. As, further illustrated, process 500 may return to block 515. For example, MIU 105 may wait for a next trigger event to occur, and when it occurs, identify the trigger event.

When it is determined that voltage threshold value is not satisfied (block 545—NO), an operational response may be selected and executed (block 550). For example, MIU 105 may select and execute the operational response, such as transmit at a lower power, not transmit or receive data, and/or not transmit or receive certain data depending on the characteristic of the data, as previously described. Additionally, or alternatively, according to various exemplary embodiments, MIU 105 may transmit at a higher data rate, may transmit a message, and/or may select a response based on the age of MIU 105, as previously described. As previously described, depending on the configuration of the temperature service, the execution and the enforcement of the selected operational response may be assigned a time window that is configurable in length.

In block 555, the measured temperature value may be logged. For example, MIU 105 may store the measured temperature value as historical data (e.g., data 212). The historical data may be used for various purposes, as described herein.

Although FIGS. 5A and 5B illustrate an exemplary process 500 of the temperature service, according to other embodiments, process 500 may include additional operations, fewer operations, and/or different operations than those illustrated in FIGS. 5A and 5B, and described herein. For example, according to other exemplary embodiments, block 555 may be omitted. Alternatively, in block 555, the measured voltage value may be logged. For example, the measured voltage value may be used in a manner similar to the stored measured temperature (e.g., used as a basis to determine whether to make a subsequent voltage measurement and/or return to the normal mode of operation), as previously described.

As set forth in this description and illustrated by the drawings, reference is made to "an exemplary embodiment," "an embodiment," "embodiments," etc., which may include a particular feature, structure or characteristic in connection with an embodiment(s). However, the use of the phrase or term "an embodiment," "embodiments," etc., in various places in the specification does not necessarily refer to all embodiments described, nor does it necessarily refer to the same embodiment, nor are separate or alternative embodiments necessarily mutually exclusive of other embodiment(s). The same applies to the term "implementation," "implementations," etc.

The foregoing description of embodiments provides illustration, but is not intended to be exhaustive or to limit the embodiments to the precise form disclosed. Accordingly, modifications to the embodiments described herein may be possible. For example, various modifications and changes may be made thereto, and additional embodiments may be implemented, without departing from the broader scope of the invention as set forth in the claims that follow. The description and drawings are accordingly to be regarded as illustrative rather than restrictive. For example, according to other exemplary embodiments, a sensor that measures an environmental condition other than temperature may be used, in addition to or instead of temperature, such as a sensor that measures the presence and/or the amount of precipitation (e.g., rain, snow, etc.). According to still other exemplary embodiments, the temperature service may be provided by a network device of access network 110 (e.g., collector 112, mobile transceiver 114, etc.). For example, collector 114 may govern its own operation based on the temperature service, as described herein. According to yet another exemplary embodiment, MIU 105 may include the temperature service, in part and in combination with network device of access network 110. For example, given the potential proximity of the network device of access network 110 to MIU 105, the network device may measure temperature and when the temperature threshold value is not satisfied, the network device may generate and transmit a network command that causes the MIU 105 to operate in a temperature sensitive mode.

The terms "a," "an," and "the" are intended to be interpreted to include one or more items. Further, the phrase "based on" is intended to be interpreted as "based, at least in part, on," unless explicitly stated otherwise. The term "and/or" is intended to be interpreted to include any and all combinations of one or more of the associated items. The word "exemplary" is used herein to mean "serving as an example." Any embodiment or implementation described as "exemplary" is not necessarily to be construed as preferred or advantageous over other embodiments or implementations.

In addition, while series of blocks have been described with regard to the processes illustrated in FIGS. 4, 5A, and 5B, the order of the blocks may be modified according to other embodiments. Further, non-dependent blocks may be performed in parallel. Additionally, other processes described in this description may be modified and/or non-dependent operations may be performed in parallel.

Embodiments described herein may be implemented in many different forms of software executed by hardware. For example, a process or a function may be implemented as "logic," a "component," or an "element." The logic, the component, or the element, may include, for example, hardware (e.g., controller 208, etc.), or a combination of hardware and software (e.g., software 214).

Embodiments have been described without reference to the specific software code because the software code can be designed to implement the embodiments based on the description herein and commercially available software design environments and/or languages. For example, various types of programming languages including, for example, a compiled language, an interpreted language, a declarative language, or a procedural language may be implemented.

Use of ordinal terms such as "first," "second," "third," etc., in the claims to modify a claim element does not by itself connote any priority, precedence, or order of one claim element over another, the temporal order in which acts of a method are performed, the temporal order in which instructions executed by a device are performed, etc., but are used merely as labels to distinguish one claim element having a certain name from another element having a same name (but for use of the ordinal term) to distinguish the claim elements.

Additionally, embodiments described herein may be implemented as a non-transitory computer-readable storage medium that stores data and/or information, such as instructions, program code, a data structure, a program module, an application, a script, or other known or conventional form suitable for use in a computing environment. The program code, instructions, application, etc., is readable and executable by a processor (e.g., controller 208) of a device.

No element, act, or instruction set forth in this description should be construed as critical or essential to the embodiments described herein unless explicitly indicated as such.

All structural and functional equivalents to the elements of the various aspects set forth in this disclosure that are known or later come to be known to those of ordinary skill in the art are expressly incorporated herein by reference and are intended to be encompassed by the claims. No claim element of a claim is to be interpreted under 35 U.S.C. § 112(f) unless the claim element expressly includes the phrase "means for" or "step for."

What is claimed is:

1. A method comprising:
    storing, by a meter interface device communicatively coupled to a utility meter that measures usage of a resource, a temperature threshold value that is based on an age of the meter interface device, wherein the temperature threshold value pertains to a threshold ambient temperature that is external from the utility meter and the meter interface device, and wherein the meter interface device includes a transceiver that transmits resource usage information;
    identifying, by the meter interface device, a trigger event;
    measuring, by the meter interface device based on the identifying, a temperature value;
    comparing, by the meter interface device based on the measuring, the temperature value to the temperature threshold value;
    determining, by the meter interface device based on the comparing, whether the temperature value satisfies the temperature threshold value; and
    executing, by the meter interface device, an operational response in response to determining that the temperature value does not satisfy the temperature threshold value, wherein the operational response includes turning off a power of a radio transmitter and a radio receiver of the meter interface device.

2. The method of claim 1, wherein the trigger event includes receiving a command from a network device to operate in a temperature sensitive mode.

3. The method of claim 1, wherein the utility meter is a water meter.

4. The method of claim 1, wherein executing the operational response comprises: waiting, by the meter interface device after the executing, until a time period during which the meter interface device is scheduled to at least one of transmit or receive data, before measuring another temperature value.

5. The method of claim 1, wherein executing the operational response comprises: determining, by the meter interface device after the executing, that another temperature value satisfies the temperature threshold value; and executing, by the meter interface device, another operational response that includes turning on the power of the radio transmitter and the radio receiver.

6. The method of claim 1, wherein executing the operational response comprises: transmitting, before turning off the power of the radio transmitter and the radio receiver, a message, which indicates at least one of the temperature value, an operational mode of the meter interface device, or that the operational mode of the meter interface device has changed, to a network device.

7. The method of claim 1, further comprising: storing, by the meter interface device, a voltage threshold value; measuring, by the meter interface device, a voltage relative to a circuit of a radio frontend included in the meter interface device, in response to determining that the temperature value does not satisfy the temperature threshold value; comparing, by the meter interface device, a voltage value to the voltage threshold value; and determining, by the meter interface device based on the comparing of the voltage value to the voltage threshold value, whether the voltage value satisfies the voltage threshold value; and wherein the executing further comprises: executing, by the meter interface device, the operational response based on determining that the temperature value does not satisfy the temperature threshold value and the voltage value does not satisfy the voltage threshold value.

8. The method of claim 1, wherein the trigger event includes one or more unsuccessful transmissions or receptions of data by the meter interface device.

9. A meter interface device of a utility meter comprising:
    a wireless communication interface;
    a memory, wherein the memory stores instructions; and
    a processor, wherein the processor executes the instructions to:
        store a temperature threshold value that is based on an age of the meter interface device, wherein the temperature threshold value pertains to a threshold ambient temperature that is external from the utility meter that measures usage of a resource and the meter interface device, and wherein the meter interface device includes a transceiver that transmits resource usage information;
        identify a trigger event;
        measure, in response to the identification of the trigger event, a temperature value;
        compare, in response to the measurement of the temperature, the temperature value to the temperature threshold value;
        determine, in response to the comparison, whether the temperature value satisfies the temperature threshold value; and
        execute an operational response in response to a determination that the temperature value does not satisfy the temperature threshold value, wherein the operational response includes turning off a power of a radio transmitter and a radio receiver of the wireless communication interface.

10. The meter interface device of claim 9, wherein the trigger event includes receiving a command from a network device to operate in a temperature sensitive mode.

11. The meter interface device of claim 9, wherein the utility meter is a water meter.

12. The meter interface device of claim 9, wherein, when executing the operational response, the processor further executes the instructions to: wait, after the executing, until a time period during which the meter interface device is scheduled to at least one of transmit or receive data, before measuring another temperature value.

13. The meter interface device of claim 9, wherein, when executing the operational response, the processor further executes the instructions to: determine, after the executing, that another temperature value satisfies the temperature threshold value; and execute another operational response that includes turning on the power of the radio transmitter and the radio receiver.

14. The meter interface device of claim 9, wherein, when executing the operation response, the processor further executes the instructions to: transmit, via the wireless communication interface before turning off the power of the radio transmitter and the radio receiver, a message, which indicates at least one of the temperature value, an operational mode of the meter interface device, or that the operational mode of the meter interface device has changed, to a network device.

15. The meter interface device of claim 9, wherein the processor further executes the instructions to: store a voltage threshold value; measure a voltage relative to a circuit of a radio frontend included in the meter interface device, in response to the determination that the temperature value does not satisfy the temperature threshold value; compare, in response to the measurement of the voltage, a voltage value to the voltage threshold value; determine, in response to the comparison of the voltage value to the voltage threshold value, whether the voltage value satisfies the voltage threshold value; and wherein, when executing the operational response, the processor further executes the instructions to: execute the operational response based on the determination that the temperature value does not satisfy the temperature threshold value and the voltage value does not satisfy the voltage threshold value.

16. The meter interface device of claim 9, wherein the trigger event includes one or more unsuccessful transmissions or receptions of data by the meter interface device.

17. A non-transitory, computer-readable storage medium storing instructions executable by a processor of a meter interface device communicatively coupled to a utility meter, which when executed cause the meter interface device to:

store a temperature threshold value that is based on an age of the meter interface device, wherein the temperature threshold value pertains to a threshold ambient temperature that is external from the utility meter that measures usage of a resource and the meter interface device, and wherein the meter interface device includes a transceiver that transmits resource usage information;

identify a trigger event;

measure, in response to the identification of the trigger event, a temperature value;

compare, in response to the measurement, the temperature value to the temperature threshold value;

determine, in response to the comparison, whether the temperature value satisfies the temperature threshold value; and execute an operational response in response to a determination that the temperature value does not satisfy the temperature threshold value, wherein the operational response includes turning off a power of a radio transmitter and a radio receiver of the meter interface device.

18. The non-transitory, computer-readable storage medium of claim 17, wherein the trigger event includes receiving a command from a network device to operate in a temperature sensitive mode.

19. The non-transitory, computer-readable storage medium of claim 17, further storing instructions executable by the processor of the meter interface device, which when executed cause the meter interface device to: store a voltage threshold value; measure a voltage relative to a circuit of a radio frontend included in the meter interface device, in response to the determination that the temperature value does not satisfy the temperature threshold value; compare, in response to the measurement of the voltage, a voltage value to the voltage threshold value; determine, in response to the comparison of the voltage value to the voltage threshold value, whether the voltage value satisfies the voltage threshold value; and wherein, when instructions to execute the operational response, further comprise instructions, which when executed cause the meter interface device to: execute the operational response based on the determination that the temperature value does not satisfy the temperature threshold value and the voltage value does not satisfy the voltage threshold value.

20. The non-transitory, computer-readable storage medium of claim 17, wherein the trigger event includes one or more unsuccessful transmissions or receptions of data by the meter interface device.

* * * * *